(12) United States Patent
Onozuka et al.

(10) Patent No.: US 6,693,839 B1
(45) Date of Patent: Feb. 17, 2004

(54) SEMICONDUCTOR MEMORY DEVICE

(75) Inventors: Yoshio Onozuka, Tokyo (JP); Eiji Kawai, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/216,240

(22) Filed: Aug. 12, 2002

(30) Foreign Application Priority Data

Aug. 10, 2001 (JP) ................................... P2001-244728

(51) Int. Cl.$^7$ ................................................ G11C 7/00
(52) U.S. Cl. ................................. 365/226; 365/230.08
(58) Field of Search ................................. 365/226, 229, 365/233, 225.7, 230.08, 189.09

(56) References Cited

U.S. PATENT DOCUMENTS

2002/0039311 * 4/2002 Takeuchi et al. ........ 365/185.09

* cited by examiner

*Primary Examiner*—Thong Le
(74) *Attorney, Agent, or Firm*—Radar Fishman & Grauer PLLC; Ronald P. Kananen

(57) ABSTRACT

A semiconductor memory device which is capable of selectively performing different functions has a chip having a nonvolatile memory capable of rewriting stored data, and a mode switcher disposed on the chip for irreversibly inhibiting data from being written in the nonvolatile memory upon elapse of a preset period of time from a time when a power supply of the semiconductor memory device is turned on if a predetermined signal is not supplied from outside of the chip within the preset period of time.

9 Claims, 3 Drawing Sheets

SEMICONDUCTOR MEMORY DEVICE

BACKGROUND OF THE INVENTION

The present invention relates to a semiconductor memory device having a nonvolatile memory.

Heretofore, semiconductor memories storing video data, audio data, or other data (hereinafter referred to as "video and other data") therein have been sold as package media. Primarily, mask ROM media are used as such package media.

Conventional package media have particular codes that are written by the steps of ion implantation and low-layer metal interconnection formation in a process of fabricating semiconductor integrated circuits. Therefore, it generally takes more than about two months to complete the conventional package media.

If an actual number of package media that are sold is much smaller than the number of manufactured package media, then since the mask ROM media are not reprogrammable, there arises a business problem in that the manufacturer has to have a large inventory of unsold package media.

When the demand grows for certain video and other data, it is necessary to manufacture new mask ROM media storing those video and other data, and hence a certain period of time is required before the desired package media can be supplied.

If an electrically reprogrammable nonvolatile semiconductor memory, such as a flash memory, is used for package media, then package media can be manufactured in a short period of time because desired information can be electrically rewritten after the package media have been completed.

Since it is easy to rewrite information stored in those electrically reprogrammable nonvolatile semiconductor memories, desired information can be written therein upon demand, and the manufacturer does not have to keep a large inventory of unsold package media.

However, the nonvolatile semiconductor memories are problematic in that since data stored therein can be rewritten by general users according to a certain procedure, it is not possible to determine whether the manufacturers are responsible or not if the nonvolatile semiconductor memories suffer a defect after data stored in the memories have been modified.

Another problem with the use of the nonvolatile semiconductor memories is that parties other than the manufacturers are given an opportunity to produce the contents, the contents may be exchanged or copied in violation of their copyright, and pirate edition producers tend to be rampant.

SUMMARY OF THE INVENTION

It is an object of the present invention to provide a semiconductor memory device which is capable of selectively performing different functions.

According to an aspect of the present invention, there is provided a semiconductor memory device including: a chip having a nonvolatile memory capable of rewriting stored data; and mode switching means disposed on the chip for irreversibly inhibiting data from being written in the nonvolatile memory upon the elapse of a preset period of time from the time when the power supply of the semiconductor memory device is turned on if a predetermined signal is not supplied from outside of the chip within the preset period of time.

According to another aspect of the present invention, there is provided a semiconductor memory device including: a chip having a nonvolatile memory capable of rewriting stored data; and mode switching means disposed on the chip for irreversibly inhibiting data from being written in the nonvolatile memory if the number of times that a power supply of the semiconductor memory device is turned on reaches a predetermined number.

The semiconductor memory device according to the present invention is capable of selectively performing different functions because it provides higher security for data stored in the nonvolatile memory and allows stored data to be selectively rewritten with predetermined signals supplied from outside of the chip within a preset period of time.

The above and other objects, features and advantages of the present invention will become apparent from the following description and the appended claims taken in conjunction with the accompanying drawings in which like parts or elements are denoted by like reference symbols.

DETAILED DESCRIPTION OF THE PREFERRED EMBODIMENTS

Figure 1:
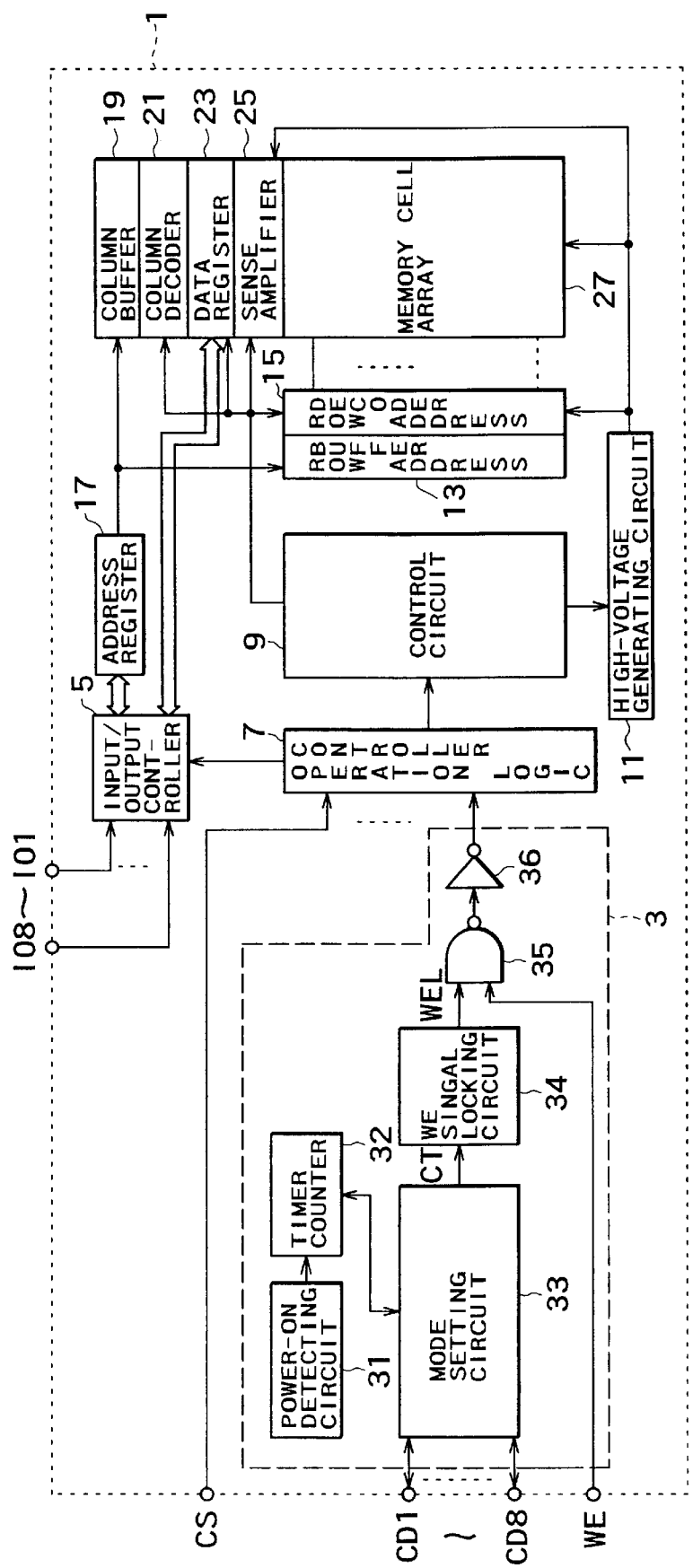
FIG. 1 is a block diagram of a semiconductor memory device according to an embodiment of the present invention.

As shown in FIG. 1, a semiconductor memory device 1 according to an embodiment of the present invention is fabricated on a single chip and includes a mode switcher 3, an input/output controller 5, an operation logic controller 7, a control circuit 9, a high-voltage generating circuit 11, a row address buffer 13, a row address decoder 15, an address register 17, a column buffer 19, a column decoder 21, a data register 23, a sense amplifier 25, and a memory cell array 27.

The mode switcher 3 includes a power-on detecting circuit 31, a timer counter 32, a mode setting circuit 33, a WE signal locking circuit 34, a NAND gate 35, and an inverter 36.

The timer counter 32 is connected to the power-on detecting circuit 31. The mode setting circuit 33 is connected to the timer counter 32 and is supplied with 8-bit code signals CD1 through CD8 from outside of the chip. The WE signal locking circuit 34 is connected to the mode setting circuit 33. The NAND gate 35 is connected to the WE signal locking circuit 34 and is supplied with a write-enable signal WE from outside of the chip. The inverter 36 is connected to the NAND gate 35.

The operation logic controller 7 is connected to the inverter 36 and is supplied with a control signal CS from outside of the chip. The control circuit 9 is connected to the operation logic controller 7, and the high-voltage generating circuit 11 is connected to the control circuit 9. The high-voltage generating circuit 11 generates a high voltage that is supplied to the row address decoder 15, the sense amplifier 25, and the memory cell array 27.

The input/output controller 5 is supplied with an address or data to be written in the memory cell array 27, as 8-bit input/output data IO1 through IO8, from outside of the chip, and outputs an address or data read from the memory cell array 27, as 8-bit input/output data IO1 through IO8, from the chip. The input/output controller 5 is connected to the operation logic controller 7.

The address register 17 is connected to the input/output controller 5. The row address buffer 13 and the column buffer 19 are connected to the address register 17.

The row address decoder 15 is connected to the row address buffer 13 and the control circuit 9. The column decoder 21 is connected to the column buffer 19. The data register 23 is connected to the column decoder 21 and the input/output controller 5. The sense amplifier 25 is connected to the data register 23 and the control circuit 9. The memory cell array 27 is connected to the row address decoder 15 and the sense amplifier 25.

Figure 2:
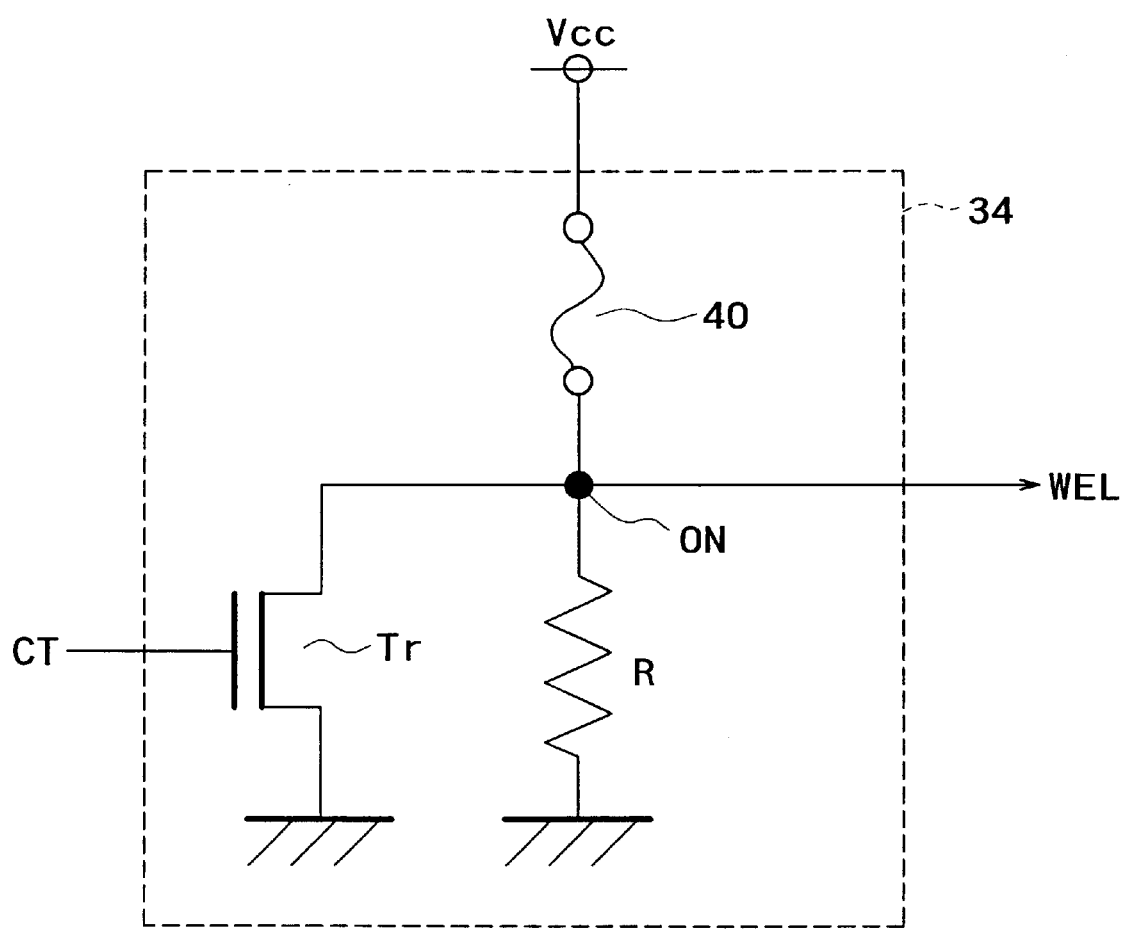
FIG. 2 is a circuit diagram of a WE signal locking circuit in the semiconductor memory device shown in FIG. 1.

The WE signal locking circuit 34 has the circuit arrangement shown in FIG. 2. As shown in FIG. 2, the WE signal locking circuit 34 includes an N-channel MOS transistor Tr, a fuse 40, an output node ON, and a pull-down resistor R.

The N-channel MOS transistor Tr is connected between the output node ON and a ground node. The gate of the N-channel MOS transistor Tr is connected to the mode setting circuit 33. The fuse 40 is connected between a power supply voltage node Vcc and the output node ON. The pull-down register R is connected between the output node ON and the ground node. The output node ON is connected to one of the input terminals of the NAND gate 35.

The semiconductor memory device thus constructed can selectively function as an ordinary, reprogrammable nonvolatile memory and a read-only memory with its reprogrammable function inhibited irreversibly, depending on a signal supplied from outside of the chip. Operation of the semiconductor memory device will be described in detail below.

First, the address of a given memory cell of the memory cell array 27 and data to be written in the memory cell are supplied as input/output data IO1 through IO8 to the input/output controller 5. The address is supplied to the address register 17, and the data is supplied to the data register 23.

The address is then supplied from the address register 17 to the column buffer 19 and the row address buffer 13. The memory cell corresponding to the address is selected by the column decoder 21 and the row address decoder 15. The data from the data register 23 are amplified by the sense amplifier 25 and written in the selected memory cell.

In the above data writing process, the column decoder 21, the data register 23, the sense amplifier 25, and the row address decoder 15 are controlled by the control circuit 9. The control circuit 9 performs the above data writing process during a period of time in which the write-enable signal WE supplied to the operation logic controller 7 is being activated into a high level. The operation logic controller 7 controls the input/output controller 5 and the control circuit 9, depending on the control signal CS supplied from outside of the chip.

The high-voltage generating circuit 11 generates a voltage higher than the power supply voltage under the control of the control circuit 9 and supplies the generated voltage to the row address decoder 15, the sense amplifier 25, and the memory cell array 27.

In the semiconductor memory device according to the present embodiment, the mode switcher 3 controls the write-enable signal WE as follows: the power-on detecting circuit 31 detects a generated power-on reset signal, thus detecting the time when the power supply is turned on.

Then, the timer counter 32 measures the preset period of time from the time when the power supply is turned on as detected by the power-on detecting circuit 31 and indicates the elapse of the preset period of time to the mode setting circuit 33. If the mode setting circuit 33 is not supplied with the predetermined code signals CD1 through CD8 within the preset period of time, then the mode setting circuit 33 generates a high-level rewrite-inhibit signal CT and supplies the high-level rewrite-inhibit signal CT to the WE signal locking circuit 34.

In response to the high-level rewrite-inhibit signal CT, the N-channel MOS transistor Tr in the WE signal locking circuit 34 is turned on. The fuse 40 has a resistance of several hundreds Ω, and the pull-down resistor R has a resistance of several hundreds kΩ. When the N-channel MOS transistor Tr is turned on, since the resistance between the output node ON and the ground node becomes several tens Ω, a large current flows between the power supply voltage node Vcc and the output node ON and melts the fuse 40.

Therefore, when the mode setting circuit 33 generates a high-level rewrite-inhibit signal CT and supplies the high-level rewrite-inhibit signal CT to the WE signal locking circuit 34, the WE signal locking circuit 34 supplies a low-level, write-enable locking signal WEL irreversibly from the output node ON to the NAND gate 35.

At this time, the NAND gate 35 steadily outputs a high-level signal irrespective of the level of the write-enable signal WE supplied from outside of the chip.

Thus, when the predetermined code signals CD1 through CD8 are not supplied from outside of the chip within the preset period of time, the write-enable signal WE supplied to the operation logic controller 7 is irreversibly inactivated into a low level, thus inhibiting data stored in the memory cell array 27 from being rewritten. At this time, the semiconductor memory device 1 is only allowed to read stored data.

If the predetermined code signals CD1 through CD8 are supplied from outside of the chip within the preset period of time, then because the mode setting circuit 33 does not generate a high-level rewrite-inhibit signal CT, the operation logic controller 7 is supplied with a write-enable signal WE, thus allowing data stored in the semiconductor memory device 1 to be written normally.

For rewriting stored data, the semiconductor memory device 1 needs to be supplied with the predetermined code signals CD1 through CD8 from outside of the chip within the preset period of time. When the given period of time elapses without the semiconductor memory device 1 being supplied with the predetermined code signals CD1 through CD8, the reprogrammable function of the semiconductor memory device 1 is automatically inhibited. Therefore, a third party finds it difficult to rewrite data stored in the semiconductor memory device 1, and the security of the semiconductor memory device 1 is increased. Furthermore, the semiconductor memory device 1 allows stored data to be rewritten without involving an increase in the circuit scale and cost.

The manufacturer of the semiconductor memory device 1 can rewrite stored data under its own management before the semiconductor memory device 1 is used by general users. Therefore, an excessive inventory of semiconductor memory devices can be reduced to an appropriate level, because the data stored therein can be rewritten by the manufacturer and the semiconductor memory devices with the rewritten data can be shipped forward again.

Figure 3:
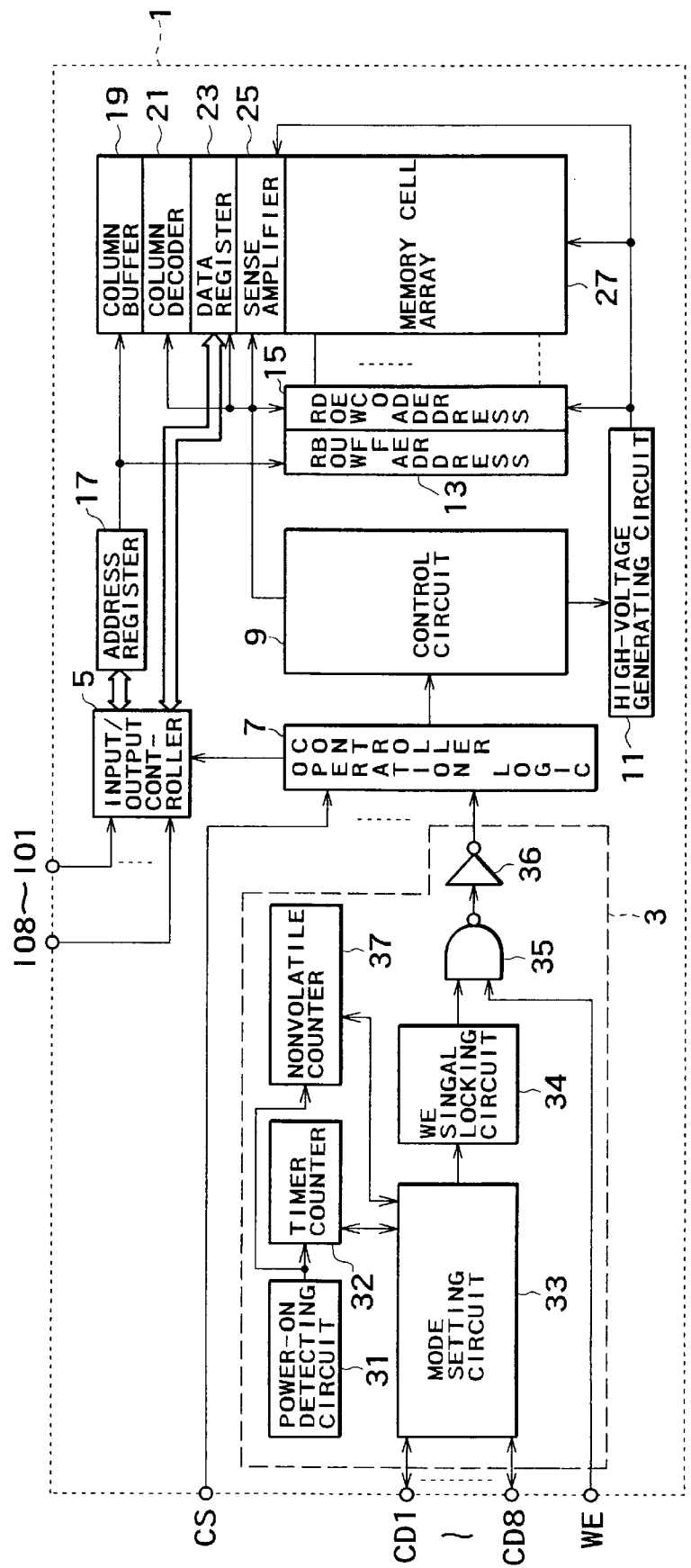
FIG. 3 is a block diagram of a semiconductor memory device according to another embodiment of the present invention.

As shown in FIG. 3, a nonvolatile counter 37 for storing the number of times that the power supply has been turned on may be incorporated in the chip. With the arrangement shown in FIG. 3, when the count stored in the nonvolatile counter 37 reaches a predetermined number, then the nonvolatile counter 37 outputs a signal to inhibit stored data from being rewritten even if the predetermined code signals CD1 through CD8 are supplied from outside of the chip within the preset period of time. The semiconductor memory device shown in FIG. 3 has better security against unauthorized rewriting of data stored therein.

The 8-bit code signals CD1 through CD8 may be replaced with a variable code represented by a voltage which is chronologically variable according to a given pattern. Such a variable code provides an analog process for preventing stored data from being rewritten by unauthorized persons.

Although certain preferred embodiments of the present invention have been shown and described in detail, it should be understood that various changes and modifications may be made therein without departing from the scope of the appended claims.

What is claimed is:

1. A semiconductor memory device comprising:
   a chip having a nonvolatile memory capable of rewriting stored data; and
   mode switching means disposed on said chip for irreversibly inhibiting data from being written in said nonvolatile memory upon elapse of a preset period of time from a time when a power supply of the semiconductor memory device is turned on if a predetermined signal is not supplied from outside of said chip within said preset period of time.

2. A semiconductor memory device according to claim 1, wherein said mode switching means comprises:
   power supply turn-on detecting means for detecting the time when said power supply is turned on;
   time measuring means for measuring said preset period of time from the time when said power supply is turned on as detected by said power supply turn-on detecting means;
   mode setting means for generating a write-inhibit signal if said predetermined signal is not supplied from outside of said chip within said preset period of time as measured by said time measuring means; and
   signal level locking means for irreversibly inactivating a write-enable signal supplied to said nonvolatile memory in response to said write-inhibit signal generated by said mode setting means.

3. A semiconductor memory device according to claim 2, wherein said signal level locking means comprises:
   a fuse and a resistive element connected in series between a power supply voltage node and a ground node;
   a transistor connected between an intermediate node, being between said fuse and said resistive element, and said ground node, in parallel to said resistive element, and having a gate for being supplied with said write-inhibit signal; and
   an AND gate for ANDing a signal outputted from said intermediate node and said write-enable signal.

4. A semiconductor memory device according to claim 1, wherein said predetermined signal includes a variable code identified by a predetermined change of a voltage.

5. A semiconductor memory device comprising:
   a chip having a nonvolatile memory capable of rewriting stored data; and
   mode switching means disposed on said chip for irreversibly inhibiting data from being written in said nonvolatile memory if the number of times that a power supply of the semiconductor memory device is turned on reaches a predetermined number.

6. A semiconductor memory device according to claim 5, wherein said mode switching means comprises:
   means for irreversibly inhibiting data from being written in said nonvolatile memory upon elapse of a preset period of time from a time when said power supply is turned on if a predetermined signal is not supplied from outside of said chip within said preset period of time.

7. A semiconductor memory device according to claim 6, wherein said mode switching means comprises:
   power supply turn-on detecting means for detecting the time when said power supply is turned on;
   time measuring means for measuring said preset period of time from the time when said power supply is turned on as detected by said power supply turn-on detecting means;
   mode setting means for generating a write-inhibit signal if said predetermined signal is not supplied from outside of said chip within said preset period of time as measured by said time measuring means; and
   signal level locking means for irreversibly inactivating a write-enable signal supplied to said nonvolatile memory in response to said write-inhibit signal generated by said mode setting means.

8. A semiconductor memory device according to claim 7, wherein said signal level locking means comprises:
   a fuse and a resistive element connected in series between a power supply voltage node and a ground node;
   a transistor connected between an intermediate node, being between said fuse and said resistive element, and said ground node, in parallel to said resistive element, and having a gate for being supplied with said write-inhibit signal; and
   an AND gate for ANDing a signal outputted from said intermediate node and said write-enable signal.

9. A semiconductor memory device according to claim 6, wherein said predetermined signal includes a variable code identified by a predetermined change of a voltage.

* * * * *